United States Patent
Yu et al.

(12) 
(10) Patent No.: US 9,012,766 B2
(45) Date of Patent: *Apr. 21, 2015

(54) ALUMINUM GRID AS BACKSIDE CONDUCTOR ON EPITAXIAL SILICON THIN FILM SOLAR CELLS

(75) Inventors: Chentao Yu, Sunnyvale, CA (US); Zheng Xu, Pleasanton, CA (US); Jiunn Benjamin Heng, San Jose, CA (US); Jianming Fu, Palo Alto, CA (US)

(73) Assignee: Silevo, Inc., Fremont, CA (US)

( * ) Notice: Subject to any disclaimer, the term of this patent is extended or adjusted under 35 U.S.C. 154(b) by 265 days.

This patent is subject to a terminal disclaimer.

(21) Appl. No.: 12/617,382

(22) Filed: Nov. 12, 2009

(65) Prior Publication Data

US 2011/0108100 A1    May 12, 2011

(51) Int. Cl.
H01L 31/068 (2012.01)
H01L 31/0224 (2006.01)
H01L 31/0216 (2014.01)
H01L 31/18 (2006.01)

(52) U.S. Cl.
CPC ........ *H01L 31/068* (2013.01); *H01L 31/02168* (2013.01); *H01L 31/022425* (2013.01); *H01L 31/1804* (2013.01); *Y02E 10/547* (2013.01)

(58) Field of Classification Search
CPC ................. H01L 31/02168; H01L 31/022425; H01L 31/1804; H01L 31/068
USPC .................................. 136/256, 255, 261, 252
See application file for complete search history.

(56) References Cited

U.S. PATENT DOCUMENTS

| | | | | |
|---|---|---|---|---|
| 3,961,997 A | * | 6/1976 | Chu | 438/97 |
| 4,015,280 A | * | 3/1977 | Matsushita et al. | 136/255 |
| 5,726,065 A | * | 3/1998 | Szlufcik et al. | 438/57 |
| 6,333,457 B1 | * | 12/2001 | Mulligan et al. | 136/255 |
| 6,552,414 B1 | * | 4/2003 | Horzel et al. | 257/655 |
| 2005/0109388 A1 | * | 5/2005 | Murakami et al. | 136/255 |
| 2005/0133084 A1 | * | 6/2005 | Joge et al. | 136/255 |
| 2006/0060238 A1 | * | 3/2006 | Hacke et al. | 136/256 |
| 2006/0231803 A1 | * | 10/2006 | Wang et al. | 252/500 |
| 2007/0202029 A1 | * | 8/2007 | Burns et al. | 423/324 |
| 2008/0196757 A1 | * | 8/2008 | Yoshimine | 136/244 |
| 2009/0101872 A1 | * | 4/2009 | Young et al. | 252/514 |
| 2010/0065111 A1 | * | 3/2010 | Fu et al. | 136/255 |

OTHER PUBLICATIONS

Warabisako et al., "Efficient Solar Cells from Metallurgical-Grade Silicon", Jpn. J. Appl. Phys. 19 (1980) Supplement 19-1 pp. 539-544.*

* cited by examiner

*Primary Examiner* — Golam Mowla
(74) *Attorney, Agent, or Firm* — Shun Yao; Park, Vaughan, Fleming & Dowler LLP

(57) ABSTRACT

One embodiment of the present invention provides a solar cell. The solar cell includes a substrate, a first heavily doped crystalline-Si (c-Si) layer situated above the substrate, a lightly doped c-Si layer situated above the first heavily doped crystalline-Si layer, a second heavily doped c-Si layer situated above the lightly doped c-Si layer, a front side electrode grid situated above the second heavily doped c-Si layer, and a backside electrode grid situated on the backside of the substrate.

11 Claims, 4 Drawing Sheets

FIG. 2A
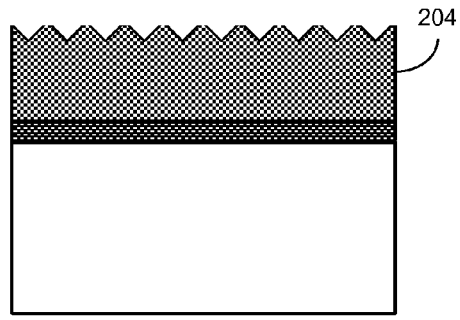
FIG. 2D
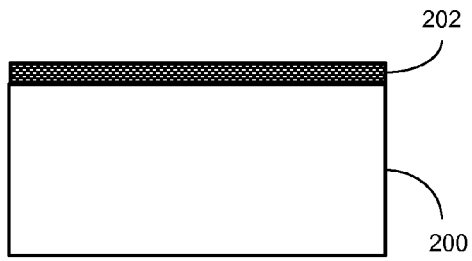
FIG. 2B
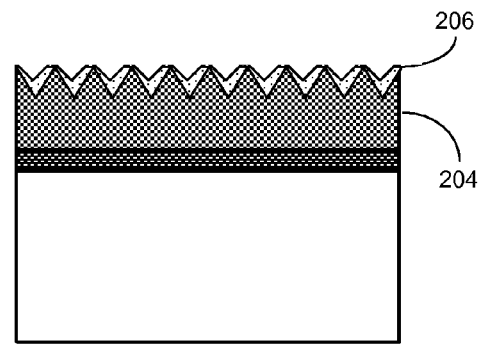
FIG. 2E
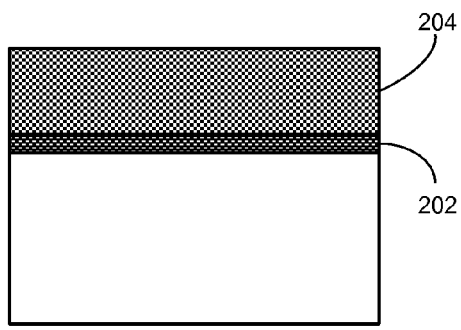
FIG. 2C
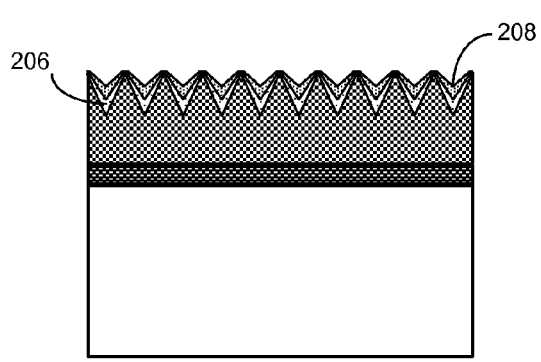
FIG. 2F
FIG. 2

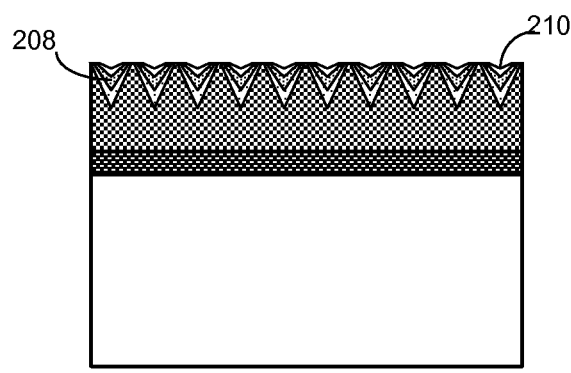
FIG. 2G
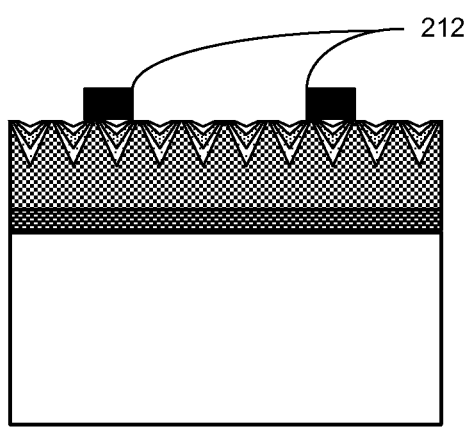
FIG. 2H
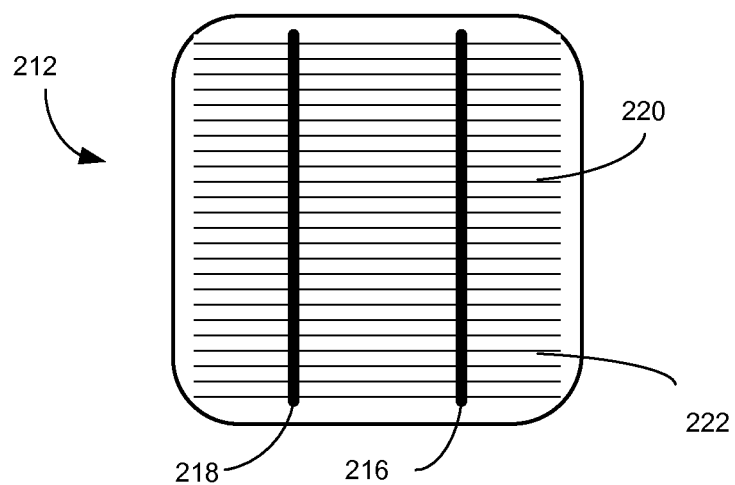
FIG. 2I
FIG. 2 (continued)

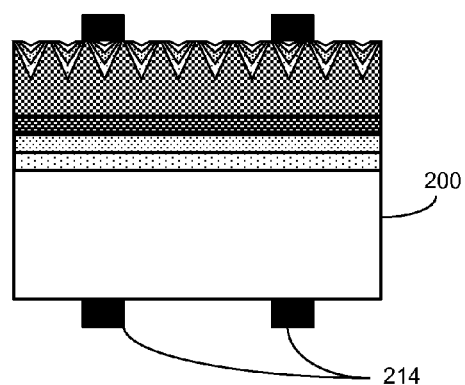
FIG. 2J
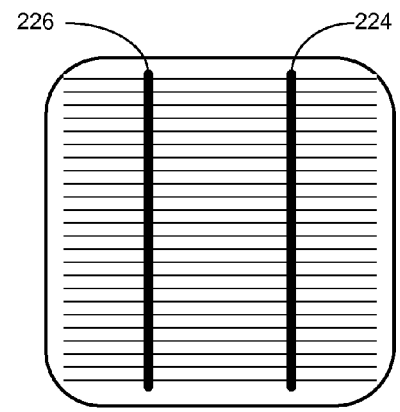
FIG. 2L
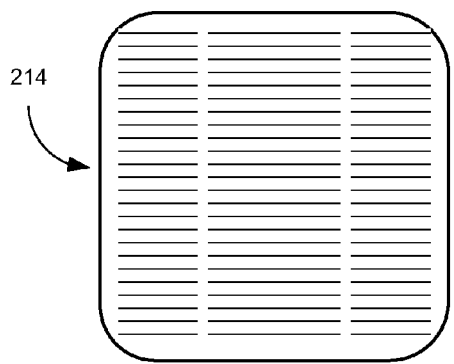
FIG. 2K
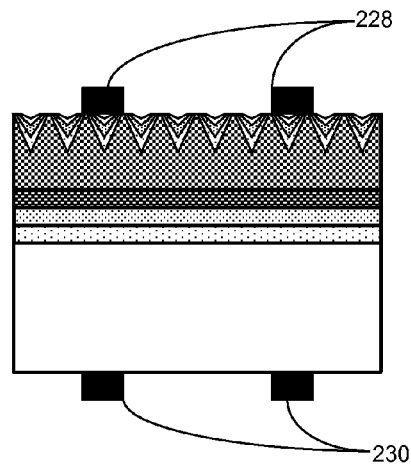
FIG. 2M
FIG. 2 (continued)

ALUMINUM GRID AS BACKSIDE CONDUCTOR ON EPITAXIAL SILICON THIN FILM SOLAR CELLS

BACKGROUND

1. Field

This disclosure is generally related to a solar cell. More specifically, this disclosure is related to a solar cell that uses an aluminum grid as a backside conductor.

2. Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

A solar cell converts light into electricity using the photoelectric effect. There are several basic solar cell structures, including a single p-n junction, p-i-n/n-i-p, and multi-junction. A typical single p-n junction structure includes a p-type doped layer and an n-type doped layer. Solar cells with a single p-n junction can be homojunction solar cells or heterojunction solar cells. If both the p-doped and n-doped layers are made of similar materials (materials with equal bandgaps), the solar cell is called a homojunction solar cell. In contrast, a heterojunction solar cell includes at least two layers of materials of different bandgaps. A p-i-n/n-i-p structure includes a p-type doped layer, an n-type doped layer, and an intrinsic (undoped) semiconductor layer (the i-layer) sandwiched between the p-layer and the n-layer. A multi junction structure includes multiple single junction structures of different bandgaps stacked on top of one another.

In a solar cell, light is absorbed near the p-n junction, generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

FIG. 1 presents a diagram illustrating an exemplary homojunction solar cell based on a crystalline-Si (c-Si) substrate (prior art). Solar cell 100 includes a front side electrode grid 102, an anti-reflective SiN layer 104, an $n^+$ c-Si emitter layer 106, a p-type c-Si substrate 108, and an aluminum (Al) backside electrode 110. Arrows in FIG. 1 indicate incident sunlight. Note that when forming Al backside electrode 110, standard operations include screen-printing and firing of Al paste. Al forms a eutectic alloy with Si at a temperature of 577° C. During the firing process, a liquid Al—Si phase is formed according to the Al—Si phase diagram. The molten Al—Si region acts as a sink for many impurities, giving a perfect gettering effect. The $p^+$ region generated by the firing of Al forms a back surface field (BSF), which introduce a barrier to minority carrier flow to the back surface of the solar cell. Note that the whole backside of the solar cell needs to be covered by the Al paste to ensure sufficient passivation.

Based on industrial surveys, crystalline-Si-wafer based solar cells dominate nearly 90% of the market. However, the cost of conventional solar grade Si is well above $100/kg, which drives the cost of solar cells to $3-$4 per Watt peak (Wp). In addition to the cost of solar grade Si wafers, the cost of Al used for the backside electrode can also be significant, given that a large amount of Al is needed to cover the whole backside of the solar cell.

SUMMARY

One embodiment of the present invention provides a solar cell.

The solar cell includes a substrate, a first heavily doped crystalline-Si (c-Si) layer situated above the substrate, a lightly doped c-Si layer situated above the first heavily doped crystalline-Si layer, a second heavily doped c-Si layer situated above the lightly doped c-Si layer, a front side electrode grid situated above the second heavily doped c-Si layer, and a backside electrode grid situated on the backside of the substrate.

In a variation on the embodiment, the substrate is an MG-Si substrate.

In variation on the embodiment, the backside electrode grid comprises Al paste.

In a further variation, the Al paste includes Al and one or more of the following materials: frit, Ag, Pd, Cr, Zn, and Sn.

In a variation on the embodiment, the backside electrode grid is formed using screen-printing or aerosol-jet printing.

In a further variation, the backside electrode grid is solderable, and the backside electrode grid is formed using a single printing step.

In a variation on the embodiment, the backside electrode grid pattern includes one or more of: straight lines, crossed lines, zigzagged lines, and circles.

In a variation on the embodiment, the first heavily doped c-Si layer and the lightly doped c-Si layer are p-type doped, and the second heavily doped c-Si layer is n-type doped.

In a variation on the embodiment, the first heavily doped c-Si layer and the lightly doped c-Si layer are deposited using a chemical-vapor-deposition (CVD) technique.

In a variation on the embodiment, the solar cell further includes a dielectric layer stack situated above the second heavily doped c-Si layer.

In a further variation, the dielectric layer stack includes at least one of: SiO2, SiNx:H, and SiOxNy.

BRIEF DESCRIPTION OF THE FIGURES

FIG. 2 presents a diagram illustrating the process of fabricating a solar cell in accordance with an embodiment of the present invention.

In the figures, like reference numerals refer to the same figure elements.

DETAILED DESCRIPTION

Figure 1:
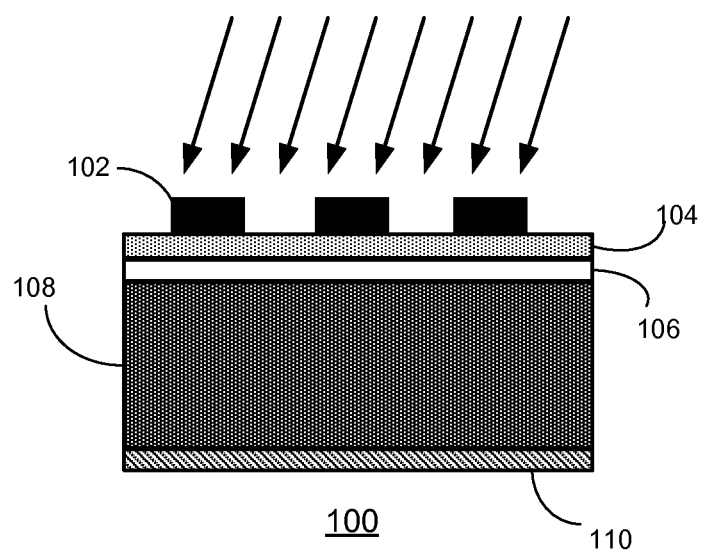
FIG. 1 presents a diagram illustrating an exemplary homojunction solar cell based on a crystalline-Si substrate (prior art).

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a solar cell that uses an Al grid as a backside electrode. A thin layer of heavily p-type doped c-Si is deposited on a metallurgical-grade Si (MG-Si) substrate forming a back-surface-field (BSF) layer, and a thin layer of lightly p-type doped c-Si is deposited on the BSF layer to form a base layer. The emitter layer can be formed by depositing a heavily n-type doped c-Si layer or by diffusing n-type dopants, such as phosphorous, at a high temperature. A dielectric layer stack that includes one or more of silicon oxy-nitride ($SiO_xN_y$), silicon-dioxide ($SiO_2$), and hydrogen-rich silicon-nitride ($SiN_x$:H) is used for passivation and anti-reflection. Instead of applying a layer of Al paste to cover the whole backside of the solar cell, the backside electrode is formed by screen-printing or aerosol-jet printing of an Al grid, thus reducing the fabrication cost.

Fabrication Process

FIG. 2 presents a diagram illustrating the process of fabricating a solar cell in accordance with an embodiment of the present invention.

In operation 2A, an MG-Si substrate 200 is prepared. Because MG-Si is much cheaper than c-Si, solar cells based on MG-Si substrates have a significantly lower manufacture cost. The purity of MG-Si is usually between 98% and 99.99%. To ensure a high efficiency of the subsequently fabricated solar cell, the starting MG-Si substrate ideally has a purity of 99.9% or better. In addition, the surface of the MG-Si substrate needs to be further purified. In one embodiment, MG-Si substrate 200 is baked at a temperature between 1100° C. and 1250° C. in a chemical-vapor-deposition (CVD) chamber filled with hydrogen ($H_2$) in order to remove native silicon-oxide in the substrate. Afterwards, at the same temperature, hydrogen chloride (HCl) gas is introduced inside the CVD chamber to leach out any residual metal impurities from MG-Si substrate 200, thus further preventing the impurities from diffusing into the subsequently grown c-Si thin films. Due to the fact that metal impurities, such as iron, have a high diffusion coefficient at this temperature, the metal impurities tend to migrate to the surface of substrate 200, and react with the HCl gas to form volatile chloride compounds. The volatile chloride compounds can be effectively purged from the chamber using a purge gas, such as $H_2$. Note that the metal-impurity leaching process can be carried out either in the CVD chamber, which is subsequently used for the growth of c-Si thin films, or in another stand-alone furnace. The metal-impurity leaching process can take between 1 minute and 120 minutes. MG-Si substrate 200 can be either p-type doped or n-type doped. In one embodiment, MG-Si substrate 200 is p-type doped.

In operation 2B, a thin layer of heavily doped (with a doping concentration of greater than $1\times10^{17}/cm^3$) c-Si film 202 is epitaxially grown on the surface of MG-Si substrate 200. Various methods can be used to epitaxially grow c-Si thin film 202 on MG-Si substrate 200. In one embodiment, c-Si thin film 202 is grown using a CVD process, such as plasma-enhanced CVD (PECVD). Various types of Si compounds, such as $SiH_4$, $SiH_2Cl_2$, and $SiHCl_3$, can be used in the CVD process to form c-Si thin film 202. In one embodiment, $SiHCl_3$ (TCS) is used due to its abundance and low cost. C-Si thin film 202 can be either p-type doped or n-type doped. In one embodiment, boron is added to make thin film 202 p-type doped. The doping concentration of thin film 202 can be between $1\times10^{17}/cm^3$ and $1\times10^{20}/cm^3$, and the thickness of thin film 202 can be between 1 μm and 8 μm. Because c-Si thin film 202 is heavily doped, it can act as a back-surface field (BSF) and barrier for minority carriers, hence reducing minority carrier recombination at the back surface of the subsequently grown base film. The existence of BSF layer 202 makes an Al-BSF layer unnecessary. Hence, instead of covering the whole backside of the solar cell with Al paste, it is possible to partially cover the backside with Al paste because the metal only serves as an electrical contact.

In operation 2C, a layer of lightly doped (with a doping concentration of less than $5\times10^{17}/cm^3$) c-Si base film 204 is epitaxially grown on top of thin film 202. The growing process of base film 204 can be similar to that used for thin film 202. Similarly, base film 204 can be either p-type doped or n-type doped. In one embodiment, base film 204 is lightly doped with a p-type dopant, such as boron. The doping concentration of base film 204 can be between $5\times10^{15}/cm^3$ and $5\times10^{17}/cm^3$, and the thickness of base film 204 can be between 5 μm and 100 μm. Note that, compared with a conventional bulk solar cell that uses a c-Si wafer as a base layer, embodiments of the present invention use an epitaxially grown crystalline-Si film as a base layer, which can be much thinner than a c-Si wafer. As a result, the manufacture cost of solar cells can be significantly reduced.

In operation 2D, the surface of base film 204 can be textured to maximize light absorption inside the solar cell, thus further enhancing efficiency. The surface texturing can be performed using various etching techniques including dry plasma etching and wet chemical etching. The etchants used in the dry plasma etching include, but are not limited to: $SF_6$, $F_2$, and $NF_3$. The wet chemical etchant can be an alkaline solution. The shapes of the surface texture can be pyramids or inverted pyramids, which are randomly or regularly distributed on the surface of base film 204.

In operation 2E, a thin layer of heavily doped c-Si film is formed on base film 204 to form an emitter layer 206. Depending on the doping type of base film 204, emitter layer 206 can be either n-type doped or p-type doped. In one embodiment, emitter layer 206 is heavily doped with an n-type dopant, such as phosphorus. The doping concentration of emitter layer 206 can be between $5\times10^{17}/cm^3$ and $5\times10^{20}/cm^3$. In one embodiment, emitter layer 206 can be formed by diffusing ions in a diffusion chamber or by in-situ doping in the CVD chamber where base film 204 is formed. In a further embodiment, emitter layer 206 can be formed using a CVD process, such as PECVD.

In operation 2F, a thin layer of $SiO_2$ (layer 208) is formed on top of emitter layer 206. $SiO_2$ layer 208 can be formed using different oxidation techniques including dry oxidation, rapid thermal oxidation (RTO), and wet oxidation. For example, $SiO_2$ layer 208 can be formed by flowing oxygen ($O_2$) over the surface of emitter layer 206 at a high temperature between 700° C. and 1050° C. The thickness of $SiO_2$ layer 208 can be between 10 Å and 300 Å, preferably between 100 Å and 200 Å. $SiO_2$ layer 208 can further reduce minority-carrier surface recombination, because the oxide growth can effectively remove Si surface interstitial defects, thus passivating the dangling bonds.

In operation 2G, a relatively thick layer of $SiN_x$:H (layer 210) is deposited on top of $SiO_2$ layer 208. Techniques used for depositing $SiN_x$:H layer 210 include, but are not limited to: PECVD, sputtering, and electron beam (e-beam) evaporation. In addition to passivation by hydrogenation and surface field effect, $SiN_x$:H layer 210 also acts as an anti-reflective layer. In order to reduce light reflection effectively, $SiN_x$:H layer 210 has a thickness between 500 Å and 1000 Å. In addition to $SiN_x$:H, other materials, such as ZnS and $TiO_2$ can also be used to form an anti-reflective layer.

In operation 2H, a frontside metal grid 212 is formed by screen printing Ag paste on top of $SiN_x$:H layer 210. During the screen printing process, Ag paste is forced through a patterned screen to form a metal pattern on the front surface of the solar cell. In a further embodiment, front side metal grid 212 is formed by aerosol-jet printing Ag ink with glass frit. FIG. 2I illustrates the top view of front side electrode grid 212. Front side electrode grid 212 includes busbars, such as busbars 216 and 218, and fingers, such as fingers 220 and 222. Busbars are thicker metal strips connected directly to the external leads, and fingers are finer metal strips that collect current for delivery to the busbars.

In operation 2J, finger strips of a backside metal grid 214 are formed by screen-printing or aerosol-jet printing Al paste on the backside of MG-Si substrate 200. FIG. 2K illustrates the bottom view of the solar cell. Note that the Al finger strips do not run all the way across the backside of the solar cell, leaving empty spaces for forming solderable busbars. Also note that, in addition to straight lines, Al finger strips can also take other geometric forms, including, but not limited to: crossed lines, zigzagged lines, and circles. In some embodiments, Al finger strips form irregular patterns. There is a trade-off between the sheet resistivity of the Al finger strip and the cost of Al. In one embodiment, Al finger strips covers roughly 10% of the back surface of the solar cell. Compared with a solar cell with its whole backside covered by Al, the cost to fabricate the solar cell with the patterned backside Al electrode is reduced because only 10% Al is needed.

In operation 2L, solderable busbars are formed on the backside of MG-Si substrate 200. Solderable busbars 224 and 226 connect to external leads and collect current from the Al finger strips. In one embodiment, busbars 224 and 226 are formed by screen-printing or aerosol-jet printing Ag paste.

In some embodiments, operation 2J and operation 2L can be combined into a single operation that prints both the fingers and the busbars. Because Al alone does not provide solderability, in some embodiments, the printing material that is used to form finger strips and busbars in a single operation includes Al paste (a mixture of Al, glass frit, and solvent) mixed with one or more of other metals including, but not limited to: Ag, Pd, Cr, Zn, and Sn.

In operation 2M, front side metal grid 212 and backside metal grid 214 are co-fired at a temperature above 500° C. to form front side and backside ohmic contact. Hence, front side metal grid 212 becomes front side electrode grid 228 and backside metal grid 214 becomes backside electrode grid 230. Traditionally, in order to form a good ohmic contact between front side electrode grid 228 and emitter layer 206, photolithography is needed to open a window in SiO$_2$ layer 208 and SiN$_x$:H layer 210. Such a lithographic process is expensive and is not suitable for low-cost, large-scale solar cell manufacture. However, when firing at a high temperature, Ag paste can etch through SiO$_2$ layer 208 and SiN$_x$:H layer 210 to make a good ohmic contact with emitter layer 206.

The use of an MG-Si substrate and a patterned backside electrode greatly reduces the fabrication cost, making it possible to fabricate solar cells at a price that is below $1/Wp. The inclusion of a heavily doped c-Si layer acting as BSF ensures the high efficiency (>17%) of the fabricated solar cell.

In addition to saving fabrication costs, using a patterned backside electrode also solves the wafer-warping problem, which is often caused by the thick layer of Al paste on the backside of a wafer, making using a thinner (<50 μm) substrate possible.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A solar cell, comprising:
   an MG-Si substrate with a purity of at least 99.99%;
   a lightly doped crystalline-Si (c-Si) epitaxial layer situated above the MG-Si substrate, wherein the lightly doped c-Si epitaxial layer acts as a base layer for the solar sell;
   a first heavily doped c-Si epitaxial layer acting as an emitter layer situated above the lightly doped c-Si base layer;
   a second heavily doped c-Si epitaxial layer situated between the MG-Si substrate and the light-doped c-Si base layer, wherein the second heavily doped c-Si epitaxial layer is formed independently of the lightly doped base layer, wherein the second heavily doped c-Si epitaxial layer has a doping concentration of $1 \times 10^{20}/cm^3$ and serves as a back surface field (BSF) layer, thereby ensuring the solar cell to have an efficiency greater than 17%;
   a front side electrode grid situated above the emitter layer; and
   a backside electrode grid situated below the substrate, wherein the backside electrode grid is in direct contact with a backside of the MG-Si substrate.

2. The solar cell of claim 1, wherein the backside electrode grid comprises Al paste.

3. The solar cell of claim 2, wherein the Al paste comprises Al and one or more of the following materials:
   frit;
   Ag;
   Pd;
   Cr;
   Zn; and
   Sn.

4. The solar cell of claim 1, wherein the backside electrode grid is formed using:
   screen-printing; or
   aerosol-jet printing.

5. The solar cell of claim 4, wherein the backside electrode grid is solderable, and wherein the backside electrode grid is formed using a single printing step.

6. The solar cell of claim 1, wherein the backside electrode grid comprises one or more of:
   straight lines;
   crossed lines;
   zigzagged lines; and
   circles.

7. The solar cell of claim 1, wherein the second heavily doped c-Si layer and the lightly doped c-Si base layer are p-type doped, and wherein the first heavily doped c-Si layer is n-type doped.

8. The solar cell of claim 1, wherein the second heavily doped c-Si layer and the lightly doped c-Si base layer are deposited using a chemical-vapor-deposition (CVD) technique.

9. The solar cell of claim 1, further comprising a dielectric layer stack situated above the first heavily doped c-Si layer, wherein the dielectric layer stack includes a SiO$_2$ layer, and wherein the SiO$_2$ layer has a thickness between 100 Å and 200 Å.

10. The solar cell of claim 9, wherein the dielectric stack further includes a SiN$_x$:H layer, and wherein the SiN$_x$:H layer has a thickness between 500 Å and 1000 Å.

11. The solar cell of claim 1, wherein the MG-Si substrate has a thickness of less than 50 microns.

* * * * *